US007965755B2

(12) United States Patent
Ikuta

(10) Patent No.: US 7,965,755 B2
(45) Date of Patent: Jun. 21, 2011

(54) SURFACE-EMITTING LASER

(75) Inventor: Mitsuhiro Ikuta, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 91 days.

(21) Appl. No.: 12/582,796

(22) Filed: Oct. 21, 2009

(65) Prior Publication Data

US 2010/0046570 A1 Feb. 25, 2010

Related U.S. Application Data

(62) Division of application No. 12/166,225, filed on Jul. 1, 2008, now Pat. No. 7,697,586.

(30) Foreign Application Priority Data

Jul. 31, 2007 (JP) ................................ 2007-198485

(51) Int. Cl.
*H01S 5/00* (2006.01)
*H01S 3/08* (2006.01)

(52) U.S. Cl. .................................... 372/50.124; 372/96

(58) Field of Classification Search ............. 372/50.124, 372/96, 99
See application file for complete search history.

(56) References Cited

U.S. PATENT DOCUMENTS

| | | | | |
|---|---|---|---|---|
| 6,778,581 | B1 * | 8/2004 | Lipson | 372/96 |
| 7,483,466 | B2 * | 1/2009 | Uchida et al. | 372/50.11 |
| 7,697,586 | B2 * | 4/2010 | Ikuta | 372/50.124 |
| 2002/0163947 | A1 | 11/2002 | Ostergaard et al. | 372/43 |
| 2005/0158902 | A1 | 7/2005 | Chua et al. | 438/32 |
| 2006/0245464 | A1 | 11/2006 | Hori et al. | 372/99 |
| 2008/0107145 | A1 | 5/2008 | Hori et al. | 372/99 |
| 2008/0112442 | A1 | 5/2008 | Ikuta | 372/19 |
| 2008/0117942 | A1 | 5/2008 | Nagatomo et al. | 372/19 |
| 2008/0164560 | A1 | 7/2008 | Almuneau et al. | 257/506 |
| 2009/0035884 | A1 | 2/2009 | Ikuta | 438/29 |

FOREIGN PATENT DOCUMENTS

| | | | |
|---|---|---|---|
| JP | 11-183735 | A | 7/1999 |
| JP | 2004-109627 | A | 4/2004 |
| JP | 2005-353623 | A | 12/2005 |
| JP | 2007-073945 | A | 3/2007 |
| WO | WO 2006/082322 | A1 | 8/2006 |

OTHER PUBLICATIONS

H.J. Unold et al., "Photonic Crystal Surface-Emitting Lasers: Tailoring Waveguiding for Single-Mode Emission," Proceedings of 27th European Conference on Optical Communication (ECOC'01—Amsterdam), Sep. 30-Oct. 4, 2001, IEEE, pp. 520-521.
D.S. Song et al., "Single-Fundamental-Mode Photonic-Crystal Vertical-Cavity Surface-Emitting Lasers," Applied Physics Letters, vol. 80, No. 21, pp. 3901-3903 (2002).

* cited by examiner

*Primary Examiner* — Armando Rodriguez
(74) *Attorney, Agent, or Firm* — Fitzpatrick, Cella, Harper & Scinto

(57) ABSTRACT

Provided is a high-output surface-emitting laser capable of reducing effects on reflectance of an upper reflection mirror in a single transverse mode. The surface-emitting laser includes plural semiconductor layers, laminated on a substrate, which includes a lower semiconductor multilayer reflection mirror, an active layer, and an upper semiconductor multilayer reflection mirror, wherein the lower or upper semiconductor multilayer reflection mirror includes a first semiconductor layer having a two-dimensional photonic crystal structure comprised of a high and low refractive index portions which are arranged in a direction parallel to the substrate, and wherein a second semiconductor layer laminated on the first semiconductor layer includes a microhole which reaches the low refractive index portion, the cross section of the microhole in the direction parallel to the substrate being smaller than the cross section of the low refractive index portion formed in the first semiconductor layer.

8 Claims, 5 Drawing Sheets

SURFACE-EMITTING LASER

CROSS REFERENCE TO RELATED APPLICATION

The present application is a division of U.S. application Ser. No. 12/166,225, filed Jul. 1, 2008, the entire disclosure of which is incorporated by reference herein.

BACKGROUND OF THE INVENTION

1. Field of the Invention

The present invention relates to a surface-emitting laser.

2. Description of the Related Art

A vertical cavity surface-emitting laser (hereinafter, referred to as VCSEL) is a laser for emitting a laser beam in a direction perpendicular to an in-plane direction of a semiconductor substrate.

A distributed Bragg reflector (hereinafter, referred to as DBR) is normally used as a reflective layer of the surface-emitting laser.

The DBR is generally formed by alternately laminating a high refractive index layer and a low refractive index layer with an optical film thickness of $\lambda/4$.

The surface-emitting laser has such excellent characteristics that a stable single mode is obtained as a longitudinal mode characteristic, a threshold value thereof is lower than a threshold value of an edge-emitting laser, and a two-dimensional array is easily formed.

Therefore, it is expected that the surface-emitting laser will be applied as a light source for optical communication and optical transmission or a light source for electrophotography.

In order to enhance applicability of the VCSEL, a VCSEL which produces a higher output while maintaining a single transverse mode oscillation is desired.

Accordingly, various structures have been considered, and as one of the promising structures, Song et al., Applied Physics Letters Vol. 80, p. 3901 (2002) (hereinafter, referred to as Document 1) proposes a photonic crystal VCSEL in which a two-dimensional photonic crystal structure of a photonic crystal fiber structure is formed in VCSEL.

FIG. 5 illustrates a structure of a surface-emitting laser described in Document 1.

In a surface-emitting laser 600 illustrated in FIG. 5, a lower multilayer reflection mirror 610, a lower spacer layer 620, an active layer 630, an upper spacer layer 640, and an upper multilayer reflection mirror 650 are laminated on a substrate 605.

When voltage is applied to an upper electrode 690 formed on the upper multilayer reflection mirror 650 and to a lower electrode 695 formed under the substrate 605, the active layer 630 emits light, and the emitted light is amplified by a resonator formed of the upper reflection mirror and the lower reflection mirror, whereby a laser oscillation is obtained. As a result, a laser beam is emitted in a direction perpendicular to the substrate.

In a part of the upper multilayer reflection mirror 650, there is formed a current confinement structure 660 including a conductive region 661 and a high resistance region 662.

The current confinement structure is formed through oxidation of an AlGaAs layer or an AlAs layer which has a high Al compositional ratio.

AlxOy which is formed through oxidation of AlGaAs or AlAs has a higher electrical resistance and a lower refractive index compared with AlGaAs or AlAs.

From an upper surface of the upper multilayer reflection mirror 650 to the active layer side, a two-dimensional photonic crystal structure including multiple holes 675 is formed. A defect is provided in a center of the two-dimensional photonic crystal structure.

In a region where the two-dimensional photonic crystal structure is formed, the effective refractive index decreases.

Here, the amount of decrease in effective refractive index described above is less than the amount of decrease in effective refractive index obtained in the region where AlGaAs or AlAs is oxidized.

In optical confinement caused by a refractive index difference, the smaller a refractive index difference is, the larger an area of a wave guide portion where a single transverse mode can be maintained is.

Accordingly, current confinement is conducted by an oxidized aperture and optical confinement in a horizontal direction is conducted by a two-dimensional photonic crystal structure, whereby an emitting area can be increased while maintaining a single transverse mode oscillation, compared with the case where both of the confinement are conducted by the oxidized aperture. In the aforementioned surface-emitting laser of Document 1, the defect size of the two-dimensional photonic crystal structure is made smaller than the current confinement size, with the result that a surface-emitting laser which maintains the single transverse mode and has a larger emitting area can be realized.

However, in the structure where a hole of the two-dimensional photonic crystal is formed from the surface of the upper multilayer reflection mirror, as in the case of Document 1, a deep hole needs to be made for achieving sufficient transverse mode control.

This is because the resonating region having a large light intensity is positioned on the active layer side of the upper multilayer reflection mirror, so the transverse mode control cannot be exhibited sufficiently without the two-dimensional photonic crystal structure.

However, when a deep hole is prepared, the refractive index changes over a long distance in a perpendicular direction within the upper multilayer reflection mirror, which leads to an increase in shift amount of a resonance wavelength of the reflection mirror.

As a result, the reflectance of the upper reflection mirror decreases for a resonance laser beam, which increases reflection loss.

For this reason, a greater emitting area can be secured but resonator performance decreases in the transverse mode control structure, and thus output cannot be sufficiently increased.

SUMMARY OF THE INVENTION

In view of the above-mentioned problem, an object of the present invention is to provide a high-output surface-emitting laser capable of reducing effects on a reflectance of an upper reflection mirror in a single transverse mode.

Therefore, in order to solve the above-mentioned problem, the present invention provides a surface-emitting laser having a structure described below.

The surface-emitting laser according to the present invention includes a plurality of semiconductor layers laminated on a substrate, the semiconductor layers including a lower semiconductor multilayer reflection mirror, an active layer, and an upper semiconductor multilayer reflection mirror, wherein one of the lower semiconductor multilayer reflection mirror and the upper semiconductor multilayer reflection mirror includes a first semiconductor layer having a two-dimensional photonic crystal structure comprised of a high refractive index portion and a low refractive index portion which are arranged in a direction parallel to the substrate, and wherein a second semiconductor layer laminated on the first semiconductor layer includes a microhole which reaches the low refractive index portion, the cross section of the microhole in the direction parallel to the substrate being smaller than the cross section of the low refractive index portion formed in the first semiconductor layer.

According to the present invention, the high-output surface-emitting laser capable of reducing effects on a reflectance of the upper reflection mirror in a single transverse mode can be realized.

Further features of the present invention will become apparent from the following description of exemplary embodiments with reference to the attached drawings.

DESCRIPTION OF THE EMBODIMENTS

Figure 1:
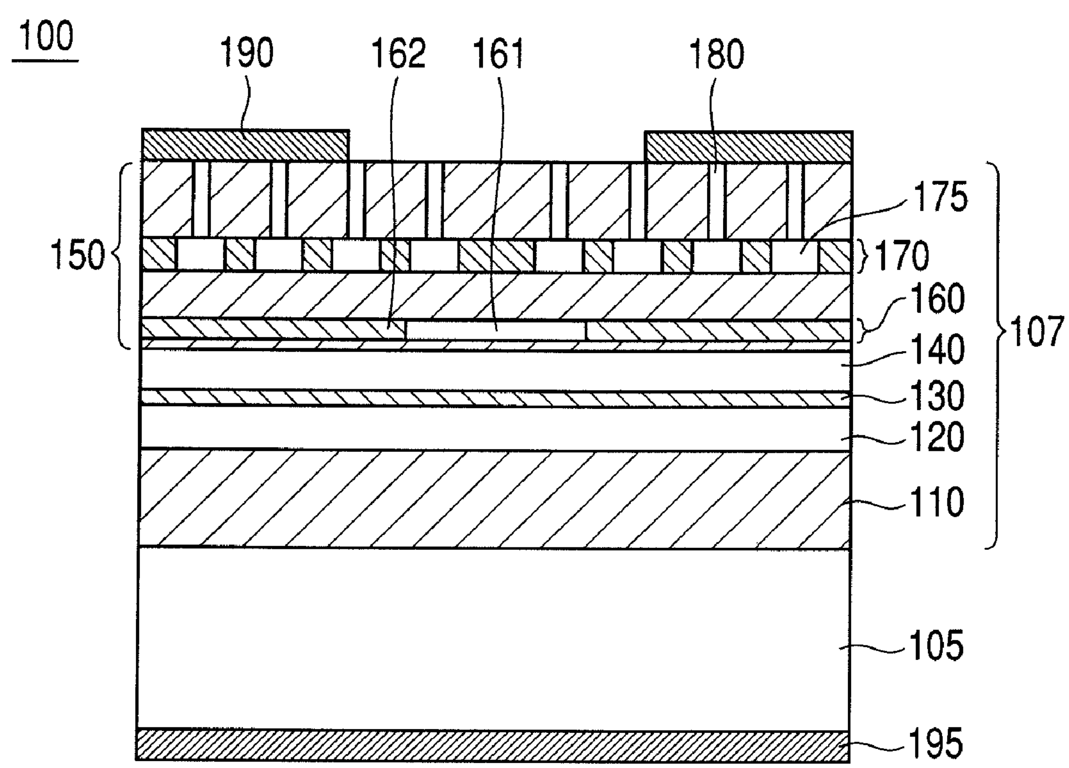
FIG. 1 is a schematic explanatory view illustrating a surface-emitting laser according to Embodiment 1 of the present invention.

Next, embodiments of the present invention are described.

The following description is given of the embodiments of a surface-emitting laser according to the present invention, in which multiple semiconductor layers including a lower semiconductor multilayer reflection mirror, an active layer, and an upper semiconductor multilayer reflection mirror are laminated on a substrate, with reference to the drawings.

Note that, in FIG. 1 to FIG. 4 described below, the same or corresponding parts are denoted by the same reference numerals.

Embodiment 1

A surface-emitting laser according to Embodiment 1 of the present invention is described.

FIG. 1 is a schematic explanatory view illustrating the surface-emitting laser according to this embodiment.

In FIG. 1, a surface-emitting laser 100 includes a substrate 105, a resonator 107, a lower semiconductor multilayer reflection mirror 110, a lower spacer layer 120, an active layer 130, an upper spacer layer 140, an upper semiconductor multilayer reflection mirror 150, a current confinement layer 160, a two-dimensional photonic crystal structure 170, and a low refractive index portion 175.

The surface-emitting laser 100 includes a microhole 180, an upper electrode 190, and a lower electrode 195.

In this embodiment, the surface-emitting laser 100 has a structure in which the resonator 107 is formed on the substrate 105.

In the resonator 107, the lower semiconductor multilayer reflection mirror 110, the lower spacer layer 120, the active layer 130, the upper spacer layer 140, and the upper semiconductor multilayer reflection mirror 150 are formed in the stated order.

The upper semiconductor multilayer reflection mirror 150 includes the current confinement layer 160 formed of a conductive region 161 and a high resistance region 162.

Further, a first semiconductor layer forming the upper semiconductor multilayer reflection mirror 150 is provided with the low refractive index portion 175 having a lower refractive index compared with the surrounding semiconductor layers, whereby a two-dimensional photonic crystal structure having a two-dimensional refractive index distribution in a direction parallel to the substrate is formed.

In other words, through formation of the low refractive index portion 175, there is formed the two-dimensional photonic crystal structure 170 formed of a high refractive index portion and a low refractive index portion which are arranged in the direction parallel to the substrate.

A second semiconductor layer is laminated on the first semiconductor layer, and the microhole 180 penetrates from an upper surface of the low refractive index portion 175 to an upper surface of the second semiconductor layer, that is, to a surface of the upper semiconductor multilayer reflection mirror 150.

The cross section of the microhole in a direction parallel to the substrate is made smaller than the cross section of the low refractive index portion of the first semiconductor layer in the direction parallel to the substrate. Further, the ring-shaped upper electrode 190 is provided on the surface of the upper semiconductor multilayer reflection mirror 150, and the lower electrode 195 is provided on the substrate 105.

In the surface-emitting laser 100, when a voltage is applied between the upper electrode 190 and the lower electrode 195, the active layer 130 emits light, and light leaking from the active layer 130 is resonated and amplified by the resonator 107. Accordingly, a laser beam is surface-emitted from the upper surface of the upper semiconductor multilayer reflection mirror 150. As the two-dimensional photonic crystal structure 170 of this embodiment, a photonic crystal fiber structure is desirable. In the photonic crystal fiber structure, the light propagation axis serves as a core, and multiple low refractive index portions which have a lower refractive index compared with the upper semiconductor multilayer reflection mirror form a cladding portion around the core.

The current confinement structure can be manufactured in the same manner as a method employed in manufacturing a conventional vertical cavity surface-emitting laser (VCSEL).

In other words, as a typical method, proton ion implantation or selective oxidation can be used.

According to the surface-emitting laser of the aforementioned embodiment, a transverse mode can be controlled by the two-dimensional photonic crystal structure.

Further, as described above, the cross section of the microhole in the direction parallel to the substrate is made smaller than the cross section of the low refractive index portion of the first semiconductor layer in the direction parallel to the substrate. As a result, compared with the conventional structure in which a hole of the two-dimensional photonic crystal structure is directly made from the surface of the upper multilayer reflection mirror, reduction in resonance performance can be suppressed.

That is, compared with the case where the hole of the two-dimensional photonic crystal structure is allowed to penetrate from the surface by employing the aforementioned structure, a less volume of the hole is required. Thus, wavelength shift of the reflection mirror can be reduced.

Further, surface roughness of the formed hole may cause scattering loss of resonance light on an interface, but its surface area can also be reduced. Accordingly, a reduction in reflectance of the multilayer reflection mirror can be suppressed, whereby reduction in lifetime of the light in the surface-emitting laser resonator can be suppressed. As a result, high-output operation can be realized.

Further, according to the surface-emitting laser of the above embodiment, the upper multilayer reflection mirror is a semiconductor, and thus the upper multilayer reflection mirror is provided with conductivity. Accordingly, the structure in which an electrode is provided on the surface of the upper multilayer reflection mirror can be realized.

Next, a method of manufacturing the surface-emitting laser 100 according to this embodiment is described. In this embodiment, as the substrate 105 of the surface-emitting laser illustrated in FIG. 1, for example, an n-type semiconductor substrate such as an n-GaAs substrate can be used.

On the n-type semiconductor substrate 105, the lower multilayer reflection mirror 110, the lower spacer layer 120, the active layer 130, the upper spacer layer 140, and the upper multilayer reflection mirror 150 are subsequently laminated as described below.

First, multiple pairs of a low refractive index layer and a high refractive index layer are laminated on the substrate 105 to form the lower multilayer reflection mirror 110.

The low refractive index layer and the high refractive index layer are laminated using, for example, metal organic chemical vapor deposition (MOCVD).

The laminated structure of the low refractive index layer and the high refractive index layer can be appropriately selected within the range where a light having a laser oscillation wavelength is not absorbed.

In this case, the following laminated structure can be employed from the viewpoints of being transparent to the light having a wavelength of 670 nm and securing a greater refractive index difference between the low refractive index layer and the high refractive index layer in order to obtain a high reflectance with a small number of pairs.

That is to say, an n-Al0.93Ga0.07As layer with a thickness of 49 nm is used as the low refractive index layer, and an n-Al0.5Ga0.5As layer with a thickness of 54 nm is used as the high refractive index layer, whereby 70 pairs thereof are laminated.

Then, on the multilayer reflection mirror 110, the lower spacer layer 120, the active layer 130, and the upper spacer layer 140 are laminated by using, for example, MOCVD.

As the lower spacer layer 120, an n-type semiconductor, for example, n-Al0.93Ga0.07As is used.

As the active layer 130, for example, GaInP/AlGaInP having the quantum well structure is used from a viewpoint of having optical gain at a wavelength of 670 nm.

As the upper spacer layer 140, a p-type semiconductor, for example, p-Al0.93Ga0.07As is used.

The lower spacer 120, the active layer 130, and the upper spacer layer 140 are laminated so that the total of their optical thicknesses is substantially equal to, for example, a laser oscillation wavelength.

Next, on the upper spacer layer 140 for forming the current confinement structure, 40 pairs of the low refractive index layer and the high refractive index layer are laminated to form the multilayer reflection mirror 150.

Now, the current confinement layer 160 for forming the current confinement structure in a part of the multilayer reflection mirror structure is formed.

As the current confinement layer 160 for forming the current confinement structure, AlGaAs having a high Al compositional ratio, for example, p-Al0.98Ga0.02As is allowed to grow by 20 nm (the low refractive index layer formed in a second pair from the bottom is formed of Al0.98Ga0.02As).

Further, on the upper side of the current confinement layer 160 within the multilayer reflection mirror structure, the first semiconductor layer for forming the two-dimensional photonic crystal structure 170 is laminated. The thickness of the first semiconductor layer is, for example, an optical thickness of 3.25 times an oscillation wavelength.

Then, on the first semiconductor layer, the second semiconductor layer for forming multiple microholes 180 is laminated.

The low refractive index layer and the high refractive index layer can be appropriately selected from the materials described above.

For instance, a p-Al0.93Ga0.07As layer with a thickness of 49 nm is used as the low refractive index layer and a p-Al0.5Ga0.5As layer with a thickness of 54 nm is used as the high refractive index layer to laminate 40 pairs thereof.

In that case, the first semiconductor layer formed of the AlGaAs layer is made to have an Al compositional ratio which is higher than the Al compositional ratio of the second semiconductor layer and higher than the Al compositional ratio of the semiconductor layer formed under the first semiconductor layer.

Next, in order to form the multiple microholes 180, a resist is applied onto the surface of the second semiconductor layer to form a two-dimensional photonic crystal pattern on the applied film.

Figure 4:
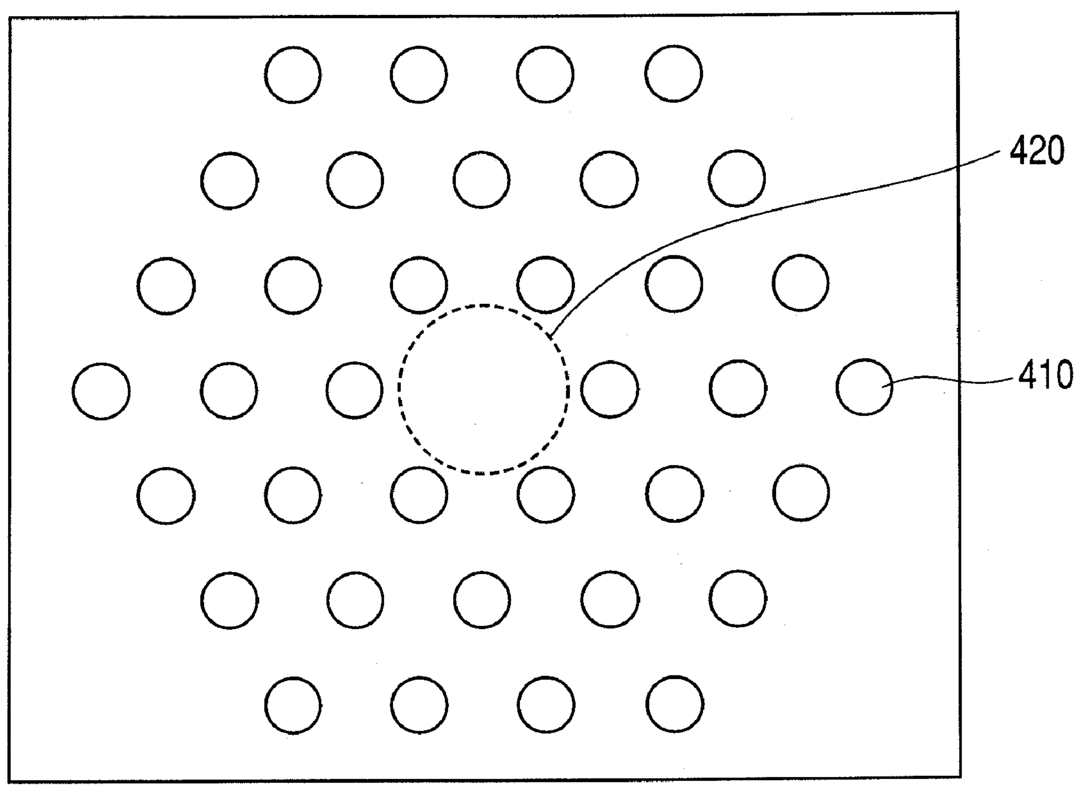
FIG. 4 is a view illustrating formation of a resist pattern in a photonic crystal structure of the surface-emitting laser according to Embodiment 1 of the present invention.
Figure 5:
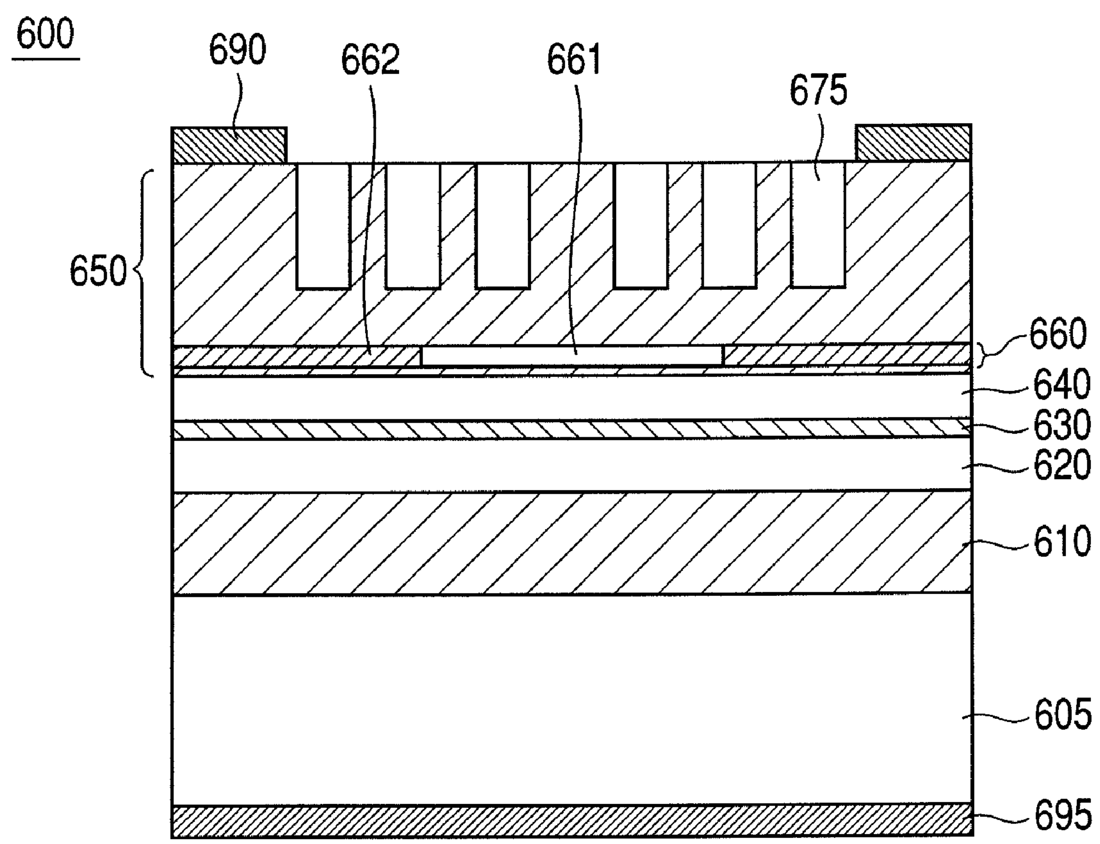
FIG. 5 is a schematic explanatory view illustrating a surface-emitting laser according to a conventional case.

For example, as illustrated in FIG. 4, a resist pattern, in which the resist is not removed for one circle in a place corresponding to the position where an emitting portion 420 is provided, is formed in a basic microhole pattern 410. In the basic microhole pattern 410, a unit form, in which the resist is removed in a shape of a circle having a diameter of 250 nm at three vertices of an equilateral triangle having a side of 2.5 μm, is periodically repeated.

Next, using ICP etching method which introduces chlorine gas, the multiple microholes 180 are formed in the second semiconductor layer (a diameter thereof is, for example, 50 nm p).

Here, a bottom of the microhole is made to position on the upper surface of the first semiconductor layer which forms the upper semiconductor multilayer reflection mirror 150 for forming the two-dimensional photonic crystal structure 170.

Next, the low refractive index portion 175 having a lower refractive index compared with the surrounding semiconductor layers is formed in the first semiconductor layer by an oxidized region which is oxidized by oxidizing species supplied through the microhole.

For example, after the resist is removed, water vapor is introduced through the microhole, and then the first semiconductor layer is subjected to heat treatment at 450° C. As a result, in the first semiconductor layer, the two-dimensional photonic crystal structure having the low refractive index portion 175 (for example, low refractive index portion having a cross section corresponding to 200 nm p) provided with a cross section, which is larger than the cross section of the microhole 180, in a direction parallel to the substrate, is formed as described below.

In other words, a portion which is in contact with the first semiconductor layer is oxidized, whereby an Al oxide having a lower refractive index compared with the surrounding semiconductor layers is formed. The Al oxide thus formed forms a region corresponding to the low refractive index portion 175 of the two-dimensional photonic crystal.

The size of the low refractive index portion can be adjusted by changing conditions of the oxidation process, that is, processing time, flow rate of water vapor, and temperature of heat treatment.

In this case, the size of a low refractive index portion can be set to a circular region having a diameter of, for example, 1 μm.

The microhole is filled with, for example, $SiO_2$ or a resin, and then a circular mesa having a diameter of 30 μm is formed.

The center of the circular mesa and the center of the two-dimensional photonic crystal pattern (in FIG. 4, center of a defect of the photonic crystal) are made to coincide with each other.

A bottom of the mesa is allowed to reach the lower multilayer reflection mirror.

Water vapor is introduced from an end surface of the current confinement layer (high resistance layer) 160 made of p-Al0.98Ga0.02As, which is exposed to a mesa sidewall, and the current confinement layer 160 is subjected to heat treatment at 450° C., whereby an $Al_xO_y$ the high resistance region 162 is formed.

In this case, the oxidation time is controlled so as to leave the conductive region 161 having a cross section of 100 $\mu m^2$ in the center of the mesa, thereby forming the current confinement structure.

Next, a polyimide protective film is formed in the vicinity of the mesa, and further the p-type upper electrode 190 is provided on an upper surface of the mesa being connected therewith.

The upper electrode is made of, for example, Ti/Au. An electrode provided in a region within 10 μm of the diameter from the center of the mesa is removed for light extraction by a lift-off method.

Finally, the n-type lower electrode 195 is formed on a rear side of the substrate 105, whereby the surface-emitting laser 100 oscillating at a wavelength of 670 nm, where a transverse mode is controlled, can be manufactured.

The above description is given on the method of forming the low refractive index portion of the two-dimensional photonic crystal by the oxidized region which is formed through oxidation of a part of the region of the first semiconductor layer by the oxidizing species supplied through the microhole. However, the method of forming the low refractive index portion of the two-dimensional photonic crystal is not limited thereto.

For example, an etching liquid (for example, buffered hydrogen fluoride) with which wet etching can be selectively performed depending on Al compositional ratio is used such that there can be formed a low refractive index portion made of a void through etching in a part of a region of the first semiconductor layer.

On this occasion, the void may be filled with a material having a lower refractive index compared with the first semiconductor layer.

Further, in this embodiment, the current confinement structure is formed in the upper multilayer reflection mirror, but may be formed in the lower multilayer reflection mirror.

Further, in this embodiment, the current confinement structure is formed by selective oxidation, but may be formed by proton implantation. In such a case, it is not always necessary to form the mesa structure, and thus surface-emitting laser devices can be easily integrated into a small area to serve as an array.

Further, in this embodiment, the microhole is filled with the material having a lower refractive index than the first semiconductor layer. Accordingly, compared with the case where the microhole is formed of air, its mechanical strength is enhanced, and the effects on the semiconductor multilayer reflection mirror from a sidewall interface, such as oxidation, can be reduced.

Embodiment 2

A surface-emitting laser according to Embodiment 2 of the present invention is described.

Figure 2:
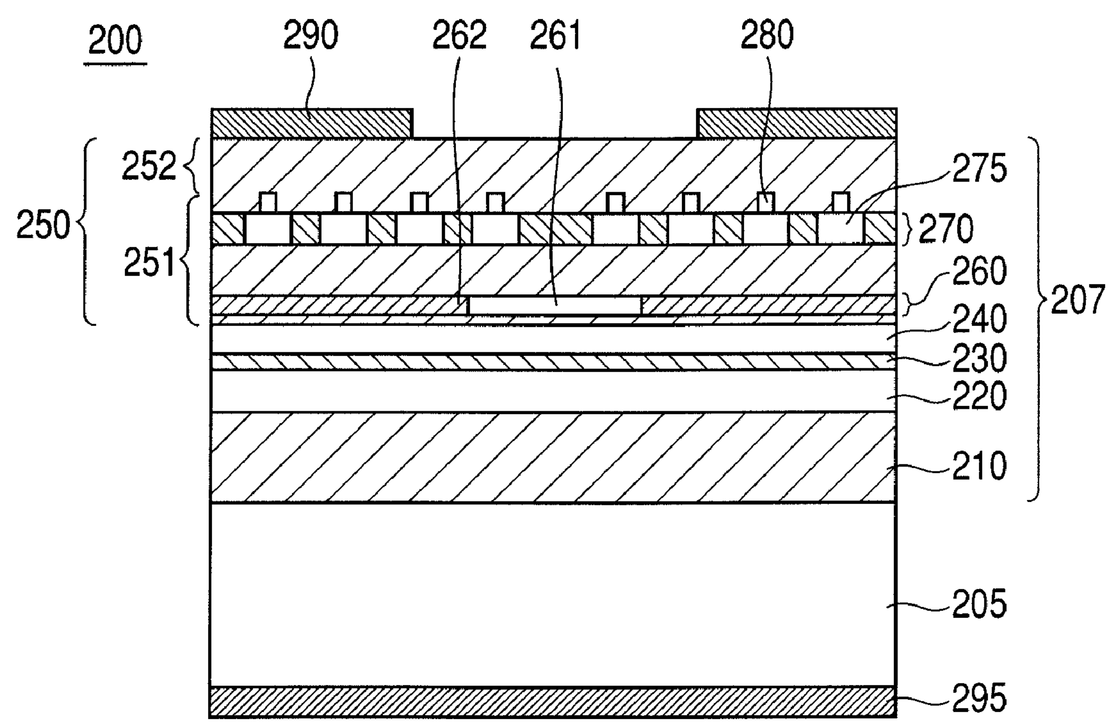
FIG. 2 is a schematic explanatory view illustrating a surface-emitting laser according to Embodiment 2 of the present invention.

FIG. 2 is a schematic explanatory view illustrating the surface-emitting laser according to this embodiment.

In FIG. 2, a surface-emitting laser 200 includes a substrate 205, a resonator 207, a lower multilayer reflection mirror 210, a lower spacer layer 220, and an active layer 230.

The surface-emitting laser 200 includes an upper spacer layer 240, an upper multilayer reflection mirror 250, and a current confinement layer 260.

The surface-emitting laser 200 includes a two-dimensional photonic crystal structure 270 and a low refractive index portion 275.

The surface-emitting laser 200 includes a microhole 280, an upper electrode 290, and a lower electrode 295.

In Embodiment 2, the surface-emitting laser 200 has a structure in which the resonator 207 is formed on the substrate 205.

In the resonator 207, the lower multilayer reflection mirror 210, the lower spacer layer 220, the active layer 230, the upper spacer layer 240, and the upper semiconductor multilayer reflection mirror 250 are formed in the stated order.

In the upper semiconductor multilayer reflection mirror 250, the current confinement layer 260 formed of a conductive region 261 and a high resistance region 262 is formed.

Further, the low refractive index portion 275 is formed in a first semiconductor layer forming the upper semiconductor multilayer reflection mirror 250, whereby there is formed the two-dimensional photonic crystal structure 270 formed of a high refractive index portion and a low refractive index portion which are arranged in a direction parallel to the substrate.

A second semiconductor layer is laminated on the first semiconductor layer, and the microhole 280 penetrates from an upper surface of the low refractive index portion 275 to a middle layer which is not the upper surface of the second semiconductor layer, that is, to the middle layer which is not the surface of the upper semiconductor multilayer reflection mirror 250.

Then, the cross section of the microhole in a direction parallel to the substrate is smaller than the cross section of the low refractive index portion formed in a region of the first semiconductor layer in the direction parallel to the substrate.

Further, the ring-shaped upper electrode 290 is provided on the surface of the upper semiconductor multilayer reflection mirror 250, and the lower electrode 295 is provided on the substrate 205.

In other words, Embodiment 2 has substantially the same structure of Embodiment 1 except that, in the upper semiconductor multilayer reflection mirror, the microhole which is in contact with the low refractive index portion of the two-dimensional photonic crystal does not penetrate to the surface of the upper semiconductor multilayer reflection mirror.

In Embodiment 2, because the volume of the microhole is smaller than that of the microhole of Embodiment 1, there is the merit that optical loss of the upper semiconductor multilayer reflection mirror can be further suppressed.

Further, because the etching depth required in forming the microhole is small, there is the merit that the process is more simplified.

Next, a method of manufacturing the surface-emitting laser 200 according to Embodiment 2 of the present invention is described. As illustrated in FIG. 2, in this surface-emitting laser device, the lower multilayer reflection mirror 210, the lower spacer layer 220, the active layer 230, the upper spacer layer 240, and the upper semiconductor multilayer reflection mirror 250 are laminated in the stated order on the n-type semiconductor substrate 205 such as an n-GaAs substrate.

The upper semiconductor multilayer reflection mirror 250 is formed of a first upper multilayer reflection mirror 251 and a second upper multilayer reflection mirror 252.

The manufacturing method until the upper spacer layer 240 is manufactured is performed in the same process as in Embodiment 1.

Next, on the upper spacer layer, the first upper multilayer reflection mirror 251 formed of 10 pairs of a low refractive index layer and a high refractive index layer is laminated.

Now, the low refractive index layer in a second pair from the bottom of the first upper multilayer reflection mirror 251 is made to serve as the current confinement layer 260 for current confinement, and p-Al0.98Ga0.02As is used therefor, for example. Further, a seventh-pair low refractive index layer from the bottom is made to serve as the first semiconductor layer for forming the two-dimensional photonic crystal structure 270, and p-Al0.96Ga0.04As is used therefor.

Further, the thickness of the first semiconductor layer is, for example, an optical thickness of 3.25 times an oscillation wavelength.

Next, the second semiconductor layer is laminated on the first semiconductor layer for forming the two-dimensional photonic crystal structure 270, and a resist is applied after the formation of a protective layer on the laminated film surface, thereby forming a pattern similar to Embodiment 1.

Next, using ICP etching method which introduces chlorine gas, the second semiconductor layer is provided with multiple microholes 280.

A bottom of the microhole is arranged so as to be located on an upper surface of the first semiconductor layer which forms the upper semiconductor multilayer reflection mirror 250 for forming the two-dimensional photonic crystal structure 270 as in the case of Embodiment 1 described above.

Next, after a resist is removed, water vapor is introduced from the microhole, and the microhole is subjected to heat treatment at 450° C., for example.

Accordingly, as in the case of Embodiment 1 described above, a two-dimensional photonic crystal structure having the low refractive index portion 275 provided with a cross section in a direction parallel to the substrate, which is larger than a cross section of the microhole 280, is formed in the first semiconductor layer.

The size of the low refractive index portion can be adjusted by changing conditions of the oxidation process, that is, processing time, flow rate of water vapor, and temperature of heat treatment. The size of the low refractive index portion is, for example, a size of a circle having a diameter of 1 μm.

Next, in order to manufacture a structure in which the microhole is formed until a middle layer in the course to reach the upper surface of the second semiconductor layer, a third semiconductor layer which is made through regrowth of the crystal is formed on the second semiconductor layer. Specifically, after the microhole is filled with, for example, $SiO_2$ or a resin, the protective layer of the surface of the first upper multilayer reflection mirror 251 is removed, and regrowth of the semiconductor crystal is performed from the surface of the first upper multilayer reflection mirror 251.

Accordingly, on the second semiconductor layer, the second upper multilayer reflection mirror 252 formed of the third semiconductor layer through crystal regrowth is formed.

In the regrowth, for example, MOCVD method is employed.

In MOCVD, growth parameters are generally controlled to make the lateral growth mode larger than the thicknesswise growth mode.

Specifically, in MOCVD of AlGaAs, V/III is increased (to 500), growth pressure is reduced (to 100 mmHg), and growth temperature is raised (to 750° C.). As a result, it is readily possible to secure a diffusion length equal to or greater than 50 nm.

After the microhole is flattened, it is desirable that the growth conditions be reset to the normal growth mode.

The second multilayer reflection mirror 252 is, for example, a multilayer film formed of 30 pairs of films.

The regrowth can be performed more easily as the area of the hole of a low refractive index medium formed on the surface of the semiconductor becomes smaller.

Thus, even though the regrowth is difficult to be performed from the two-dimensional photonic crystal structure due to the size of the low refractive index hole, the regrowth is performed easily from the surface where a microhole smaller than a low refractive index hole of the two-dimensional photonic crystal structure is made. After that, as in the case of Embodiment 1, a circular mesa and a current confinement layer are formed, and then the upper electrode 290 and the lower electrode 295 are formed, whereby the surface-emitting laser 200 can be manufactured.

In this manner, according to the structure of this embodiment, because of the presence of the layer where the microhole having a smaller hole diameter compared with the hole of the two-dimensional photonic crystal structure is made on the hole of the two-dimensional photonic crystal structure, the crystal regrowth of the semiconductor can be performed thereon.

In other words, the hole diameter of the hole of the two-dimensional photonic crystal for controlling a transverse mode is generally equal to or more than several hundreds nm, so it is difficult to directly perform a high-quality crystal regrowth of a semiconductor thereon. However, according to the structure of this embodiment, higher-quality regrowth can be performed.

Accordingly, a high-quality upper semiconductor multilayer reflection mirror can be laminated, and thus a problem of current injection and a problem of the process can be solved while controlling the transverse mode of the surface-emitting laser.

Embodiment 3

A surface-emitting laser according to Embodiment 3 of the present invention is described.

Figure 3:
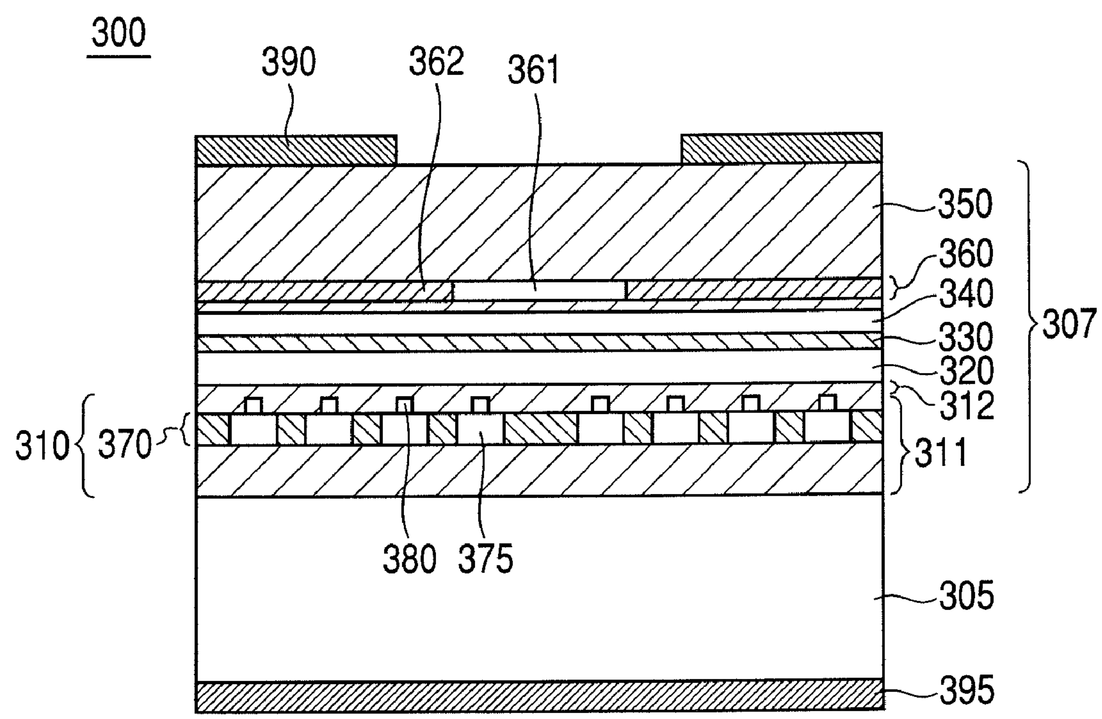
FIG. 3 is a schematic explanatory view illustrating a surface-emitting laser according to Embodiment 3 of the present invention.

FIG. 3 is a schematic explanatory view illustrating the surface-emitting laser according to this embodiment.

In FIG. 3, a surface-emitting laser 300 includes a substrate 305, a resonator 307, a lower multilayer reflection mirror 310, a lower spacer layer 320, and an active layer 330.

The surface-emitting laser 300 includes an upper spacer layer 340, an upper multilayer reflection mirror 350, and a current confinement layer 360.

The surface-emitting laser 300 includes a two-dimensional photonic crystal structure 370 and a low refractive index portion 375.

The surface-emitting laser 300 includes a microhole 380, an upper electrode 390, and reference a lower electrode 395.

In Embodiment 2, the two-dimensional photonic crystal structure and the microhole are formed in the upper semiconductor multilayer reflection mirror, but can be formed in the lower multilayer reflection mirror, as described in this embodiment.

In the surface-emitting laser 300 according to this embodiment, the lower multilayer reflection mirror 310, the lower spacer layer 320, the active layer 330, the upper spacer layer 340, and the upper multilayer reflection mirror 350 are laminated on the substrate 305.

Besides, the two-dimensional photonic crystal structure 370 and the microhole 380 are formed in the lower multilayer reflection mirror 310. Such an embodiment is also applicable to the present invention.

In this structure, 35 pairs of the lower multilayer reflection mirrors 311 are laminated on the substrate 305, and then the microhole and the photonic crystal structure are formed.

Then, using crystal regrowth of a semiconductor, a lower multilayer reflection mirror 312, the lower spacer layer 320, the active layer 330, the upper spacer layer 340, and the upper multilayer reflection mirror 350 are laminated from a surface of the lower multilayer reflection mirror 311.

In this embodiment, the lower spacer layer and the active layer are formed after the formation of the photonic crystal structure.

Consequently, the semiconductor multilayer reflection mirror 312 formed on the active layer side is not affected by manufacturing deviation such as overetching, which stabilizes its characteristics.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

In particular, an appropriate change can be made to a material or a shape of the semiconductor layer, the photonic crystal structure, and the electrode, a pattern of the refractive index distribution of the photonic crystal structure, and the like.

For instance, a description has been made on the case where an AlGaAs layer is used as the semiconductor layer in the above embodiments, but an AlAs layer may also be used. This application claims the benefit of Japanese Patent Application No. 2007-198485, filed Jul. 31, 2007, which is hereby incorporated by reference herein in its entirety.

What is claimed is:

1. A surface-emitting laser, comprising:

a plurality of semiconductor layers laminated on a substrate, the plurality of semiconductor layers including a lower semiconductor multilayer reflection mirror, an active layer, and an upper semiconductor multilayer reflection mirror; and a current confinement layer including an oxidized region and a non-oxidized region, wherein the non-oxidized region is formed of one of AlGaAs and AlAs, wherein a first semiconductor layer includes AlGaAs having a lower Al compositional ratio than an Al compositional ratio of the non-oxidized region, wherein one of the lower semiconductor multilayer reflection minor and the upper semiconductor multilayer reflection mirror includes a first semiconductor layer having a two-dimensional photonic crystal structure of that includes a high refractive index portion and a low refractive index portion, which are arranged in a direction parallel to the substrate, and wherein a second semiconductor layer laminated on the first semiconductor layer includes a microhole, which reaches the low refractive index portion, a cross section of the microhole in the direction parallel to the substrate being smaller than a cross section of the low refractive index portion of the first semiconductor layer.

2. A surface-emitting laser according to claim 1, wherein the microhole is formed to extend from an upper surface of the first semiconductor layer including the low refractive index portion to a position within the second semiconductor layer without extending to an upper surface of the second semiconductor layer.

3. A surface-emitting laser according to claim 2, wherein a structure in which the microhole is formed is constructed by forming a third semiconductor layer through crystal regrowth on the second semiconductor layer.

4. A surface-emitting laser according to claim 1, wherein the first semiconductor layer has an Al compositional ratio that is higher than an Al compositional ratio of the second semiconductor layer and higher than a Al compositional ratio of a semiconductor layer formed under the first semiconductor layer.

5. A surface-emitting laser according to claim 4, wherein the low refractive index portion includes an oxidized region formed through oxidation of a part of a region of the first semiconductor layer by an oxidizing species supplied through the microhole.

6. A surface-emitting laser according to claim 1, wherein the low refractive index portion includes a void formed in a part of a region of the first semiconductor layer.

7. A surface-emitting laser according to claim 6, wherein the void is filled with a material having a lower refractive index than that of the first semiconductor layer.

8. A surface-emitting laser according to claim 1, wherein the microhole is filled with a material having a lower refractive index than that of the first semiconductor layer.

* * * * *